(12) United States Patent
Chan et al.

(10) Patent No.: US 6,383,921 B1
(45) Date of Patent: May 7, 2002

(54) SELF ALIGNED SILICIDE CONTACT METHOD OF FABRICATION

(75) Inventors: Ching-Hsu Chan, Taipei; Kirk Hsu, Hsinchu Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/721,146

(22) Filed: Nov. 22, 2000

(30) Foreign Application Priority Data

Nov. 14, 2000 (TW) ........................................ 89124067 A

(51) Int. Cl.$^7$ ............................................ H01L 21/4763
(52) U.S. Cl. ...................... 438/649; 438/682; 438/233
(58) Field of Search ................................ 438/304, 305, 438/197, 649, 682, 595, 596, 301, 655, 233

(56) References Cited

U.S. PATENT DOCUMENTS 5,473,184 A * 12/1995 Murai
6,245,620 B1 * 6/2001 Jang et al.

\* cited by examiner

*Primary Examiner*—Tuan H. Nguyen
(74) *Attorney, Agent, or Firm*—Charles C. H. Wu; Charles C. H. Wu & Associates

(57) ABSTRACT

A method of fabricating a self-aligned contact (SAC) and gate structure is described. A gate oxide layer, a conductive gate a cap layer and a source/drain are formed on a substrate. A conformal buffer layer is formed. An undoped polysilicon spacer is formed. A dielectric layer is formed over the substrate. Photolithography and etching technologies are used to form a self-aligned opening in the dielectric layer and conformal buffer layer. The self-aligned contact opening is filled with a conductive layer, to form a self-aligned contact.

10 Claims, 2 Drawing Sheets

SELF ALIGNED SILICIDE CONTACT METHOD OF FABRICATION

CROSS-REFERENCE TO RELATED APPLICATION

This application claims the priority benefit of Taiwan application serial no. 89124067, filed Nov. 14, 2000.

BACKGROUND OF THE INVENTION

1. Field of the Invention

The present invention relates to metal oxide semiconductor (MOS). More particularly, the present invention relates to self-aligned contact method of fabrication.

2. Description of the Related Art

Etching technology for Self-aligned contact etching has become an essential technology for one quarter micron devices or those with even smaller device size. Self-aligned contact etching can be used on devices that are highly integrated and have high operating speed. It is necessary to continuously improve the technology.

In the conventional method of fabricating a self-aligned contact (SAC), a silicon nitride cap layer and silicon nitride spacer are usually formed on a gate. A dielectric layer is then formed over the substrate. Photolithography and etching technologies are performed to form a self-aligned silicide contact opening in. the, dielectric layer. The self-aligned contact opening is then filled with conductive material to complete the fabrication of a self-aligned contact (SAC).

In the conventional method described above, the silicon nitride cap layer and the silicon nitride spacer are formed in order to utilize the differences of etching selectivity between the silicon dioxide dielectric layer and the silicon nitride cap layer and spacer, which enables a self-aligned contact opening to be formed in a later step.

Anisotropic dry etching is usually used in the conventional method of forming a (SAC) opening to remove the dielectric layer above the source/drain region. Anisotropic over-etching is performed to insure that the dielectric layer can be removed completely. Because there is not much difference of the etching selectivity for the silicon oxide dielectric layer to silicon nitride layer and the silicon nitride spacer, the silicon nitride of the cap layer and gate spacer may be etched too much. Over-etching may even also cause damage on the spacer comer. As a result, when the self-aligned contact opening is filled with conductive layer, the damage of the spacer may cause a parasitic capacitor between the gate and the conductive layer due to the separation is too small. Even worse, a short circuit between the gate and the conductive layer may occur, causing failure of the device.

Moreover, in the conventional method for solving the above problem by increasing the thickness of the silicon nitride spacer may cause a reduction of integration.

SUMMARY OF THE INVENTION

The present invention uses an undoped polysilicon gate spacer and takes properties of hight etching selectivity between polysilicon and silicon nitride for forming a contact opening. The high etching selectivity of the polysilicon and silicon nitride allows the gate with greater protection, which can prevent parasitic capacitance or short-circuiting.

As embodied and broadly described herein, the invention provides a method of fabricating a self-aligned contact of a semiconductor device. A substrate with an isolation structure is provided. A gate oxide layer, a conductive gate on the gate oxide layer, a cap layer on the conductive gate, and a source/drain are formed consecutively on the substrate. A conformal buffer layer is formed over the substrate. An undoped polysilicon gate spacer is then formed on sidewall of the gate. A dielectric layer is then formed over the substrate. Photolithography and etching technologies are used to form a self-aligned contact opening in the dielectric layer and the conformal buffer layer. The self-aligned contact opening is filled with a conductive layer to form a self-aligned contact.

The self-aligned contact is formed the method of the present invention using undoped polysilicon as the material for the gate spacer. Due to the high etching selectivity between polysilicon and silicon oxide, the protection to the gate can be enhanced, thereby preventing the problems of parasitic capacitance and short-circuiting.

The etching selectivity between polysilicon and nitride is higher than that between silicon nitride and silicon oxide. In this way, the thickness of the spacer can be effectively reduced and the degree of integration increased while providing the same degree of protection to the gate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention. In the drawings.

DESCRIPTION OF THE PREFERRED EMBODIMENTS

Figure 1:
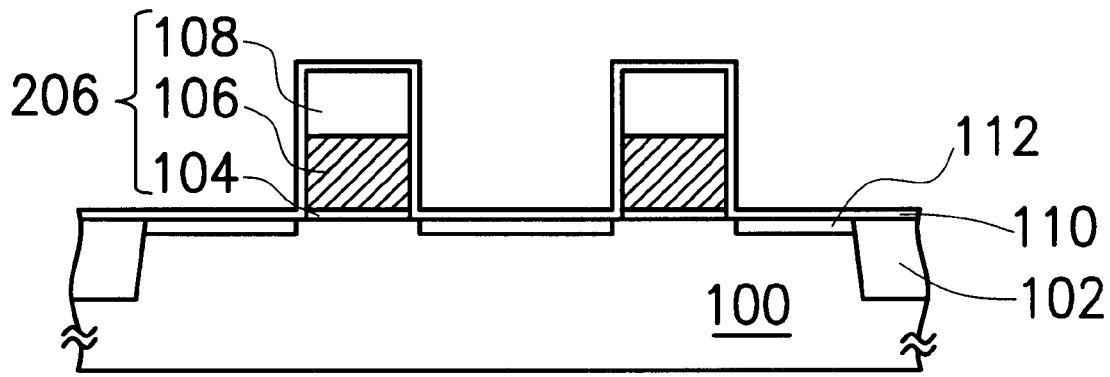
FIGS. 1–4 are cross-sectional views, schematically illustrating the fabrication of a self-aligned contact (SAC) semiconductor device, according to one preferred embodiment of this invention.

As shown in FIG. 1, a substrate 100 with an isolation structure 102 is provided. The method for forming isolation structure 102 can include shallow trench isolation (STD. Substrate 100 can also include a lightly doped well region or semiconductor substrate.

A gate structure 206 is formed on substrate 100. The gate structure 206 includes a gate oxide layer 104, a conductive gate 106 and a cap layer 108. Thermal oxidation can be used to form the gate oxide layer 104. The conductive gate 106 can be formed from both the lightly doped polysilicon layer and silicide layer directly above. The method for forming the lightly doped polysilicon layer includes conducting low pressure chemical vapor deposition on the substrate 100 to form a polysilicon layer. Arsenic or phosphorus is used to implant into the polysilicon layer. Alternatively, the polysilicon layer can also be doped in-situ. An annealing step is then performed to activate the dopants in order to provide the polysilicon layer with better conductivity. The silicide layer can, for example, include tungsten silicide, titanium silicide, or molybdenum silicide. The material for the cap layer 108 can include silicon nitride. Chemical vapor deposition is the preferred method of forming the cap layer 108. The thickness of the cap layer 108 is about 1000 Å to about 1500 Å.

A conformal buffer layer 110 is then formed above the substrate 100. A source/drain region 112 is formed in the substrate 100. The conformal buffer layer 110 is a thin silicon nitride layer formed by plasma enhanced chemical vapor deposition (PECVD) or a silicon oxide layer formed using tetra-ethyl-ortho-silicate as a gas source. The method of forming the source/drain region 112, can include implanting ions into the substrate 100 using the cap layer 108 as a mask.

Figure 2:
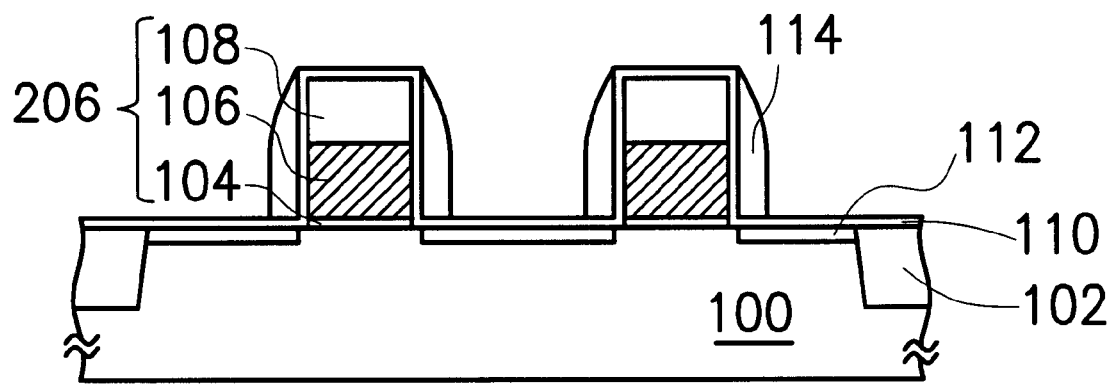

As shown in FIG. 2, a low chemical vapor deposition (LCVD) step is performed to form an undoped polysilicon layer over the substrate 100 and above the gate structure 206. Dry etching process is used to etch back the polysilicon layer in order to form an undoped polysilicon spacer 114 on a sidewall of the gate structure 206. The width of the spacer at the lower portion is about 800 Å.

Figure 3:
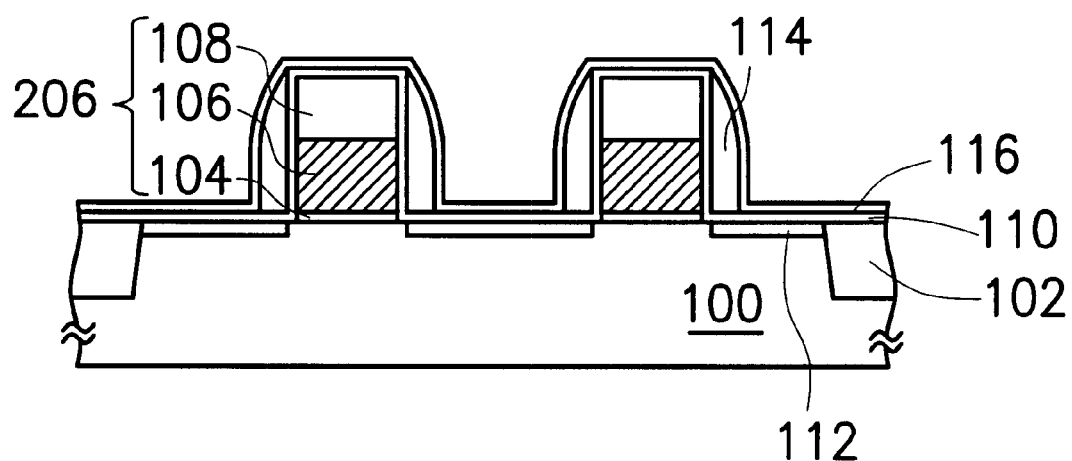

As shown in FIG. 3, a silicide block layer 116 is formed on the substrate 100 to completely cover the area where a silicide is not to be formed, in order to prevent a reaction on the exposed silicon with metal during the formation of silicide a subsequent step. FIG. 3 of the present invention illustrates the memory region designated for the formation of a dynamic random access memory (DRAM). In FIG. 3, the silicide block layer 116 covers the entire portion of substrate 100 shown in the figure. Actually, for example, the logic region of the substrate remains being exposed. The material of the silicon block layer 116 can be silicon nitride, for example. The method of formation can include chemical vapor deposition, for example.

Figure 4:
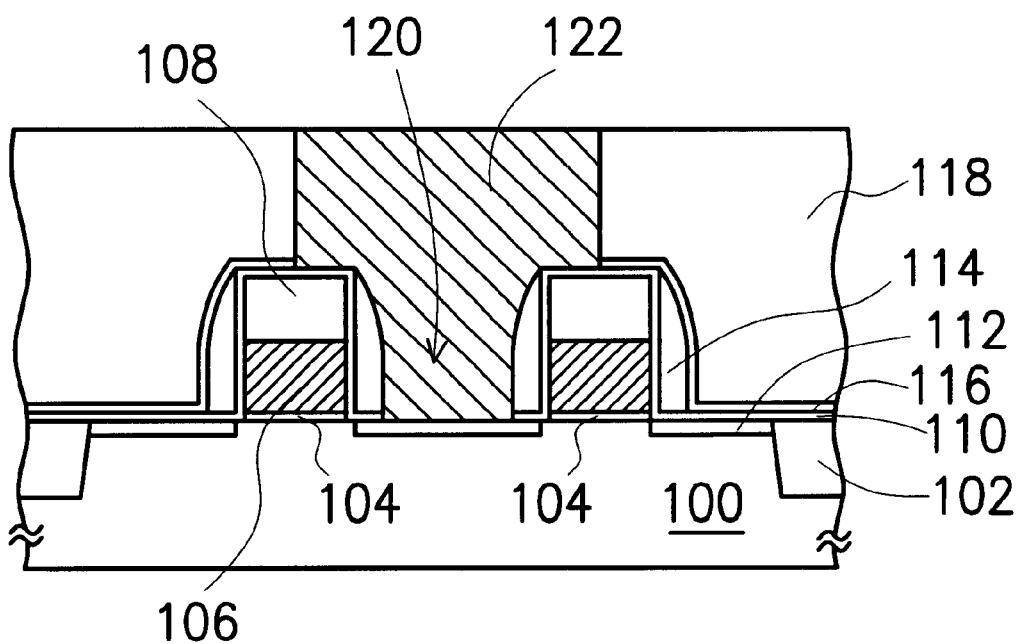

As shown in FIG. 4, a chemical vapor deposition step is conducted to form a dielectric layer 118 covering the silicide block layer 116. The material of dielectric layer 118 can be silicon nitride, for example. Using the patterned photoresist as a mask (not shown) the silicide block layer 116, and the conformal buffer layer 110 are etched to form a self-aligned contact opening 120 that exposes the source/drain region 112. A conductive layer 122 is formed to fill the self-aligned contact opening 120. The self-aligned contact opening 120 can be formed by a dry etching method using an etching gag that containing a mixture gag of $C_5F_8$ and oxygen. The material of the conductive layer 122 used to fill the self-aligned contact opening 120 can include doped polysilicon or silicide.

In the conventional method, the etching selectivity ratio of silicon oxide to silicon nitride for the etchant is about 12 to about 18. Thus, when etching is conducted to form the self-aligned contact opening, over-etching is performed to insure that the dielectric layer is completely removed. However, because there is not much difference between the etching selectivity of silicon oxide and silicon nitride, over-etching causes damage to the spacer corner of the silicon nitride gate. Damage to the spacer corner causes a significant reduction in the inner separation between the gate and the conductive layer, which leads to parasitic capacitance. If the gate and conductive layer make contact, then short-circuiting and device failure can occur.

On the contrary to the conventional method, the present invention uses undoped polysilicon to form the gate spacer. The etching selectivity ratio of the silicon oxide dielectric layer to the undoped polysilicon gate spacer is about 20–30, which is about 1.5 to 2 times of the etching selectivity of silicon nitride used in the conventional method. Thus, when the contact opening is etched, the undoped polysilicon spacer has greater etch resistance. Consequently, when etching is completed, the spacer corner is not damaged, which prevents parasitic capacitance or short-circuiting.

In conclusion, the self-aligned contact opening in the method of the present invention is achieved by forming an undoped polysilicon spacer on a sidewall of a gate. A high etching selectivity for the undoped polysilicon spacer and the silicon dielectric layer is used to increase the resistance of the spacer to the etching solution. In this way, protection of the gate is enhanced which prevents parasitic capacitance and short-circuiting.

The invention has used undoped polysilicon spacer to form the self-aligned contact opening with high etching selectivity. While under the same protection degree, the thickness of the spacer can be effectively reduced, so that the integration can increase.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating self-aligned contact, the method comprising:

forming a gate structure on a substrate, wherein the gate structure comprises a cap layer on a top layer of the gate structure;

forming a conformal buffer layer over the gate structure and the substrate;

forming a source/drain region in the substrate, using the gate structure as a mask;

forming an undoped polysilicon spacer on a portion of the conformal buffer layer on a sidewall of the gate structure;

forming a silicide block layer over the conformal buffer layer and the undoped polysilicon spacer to prevent a formation of a silicide layer in a memory region during a subsequent formation of the silicide layer in a logic region;

forming a dielectric layer over the substrate;

forming a self-aligned contact opening in the dielectric layer, the silicide block layer, and the conformal buffer layer to expose the source/drain region and the undoped polysilicon spacer; and forming a conductive layer in the self-aligned contact opening.

2. The method of claim 1, wherein the step of forming the undoped polysilicon spacer includes chemical vapor deposition and etching.

3. The method of claim 1, wherein the dielectric layer includes silicon oxide.

4. The method of claim 3, wherein the step of forming the self-aligned contact opening includes a dry etching process.

5. The method of claim 4, wherein the dry etching process includes a gas etchant mixture of $C_5F_8$ and oxygen.

6. The method of claim 5, wherein the etchant has an etching selectivity ratio of about 20–30 for silicon oxide to polysilicon.

7. The method of claim 1, wherein the silicide block layer includes silicon nitride.

8. The method of claim 1, wherein the conformal buffer layer includes silicon nitride.

9. The method of claim 1, wherein the conformal buffer layer includes silicon oxide formed by using tetra-ethyl-ortho-silicate as a reaction gas.

10. The method of claim 1, wherein the cap layer of the gate structure includes silicon nitride.

* * * * *